(12) United States Patent
Shinde (10) Patent No.: US 9,124,084 B2
(45) Date of Patent: Sep. 1, 2015

(54) CHARGE INJECTION AND DRAIN-BASED ELECTRICAL OVERSTRESS (EOS) PROTECTION APPARATUS AND METHOD

(75) Inventor: Suhas Vishwasrao Shinde, Holzkirchen (DE)

(73) Assignee: INTEL CORPORATION, Santa Clara, CA (US)

( * ) Notice: Subject to any disclaimer, the term of this patent is extended or adjusted under 35 U.S.C. 154(b) by 253 days.

(21) Appl. No.: 13/997,085

(22) PCT Filed: Nov. 3, 2011

(86) PCT No.: PCT/US2011/059229
§ 371 (c)(1),
(2), (4) Date: Jun. 21, 2013

(87) PCT Pub. No.: WO2013/066338
PCT Pub. Date: May 10, 2013

(65) Prior Publication Data
US 2013/0335867 A1    Dec. 19, 2013

(51) Int. Cl.
*H02H 9/00*   (2006.01)
*H03K 19/003* (2006.01)
*H02H 1/00*   (2006.01)
*H02H 1/04*   (2006.01)
*H02H 3/22*   (2006.01)
*H02H 9/06*   (2006.01)

(52) U.S. Cl.
CPC ............ *H02H 9/00* (2013.01); *H03K 19/00361* (2013.01)

(58) Field of Classification Search
USPC .......................................................... 361/56
See application file for complete search history.

(56) References Cited

U.S. PATENT DOCUMENTS

| 7,009,827 B1* | 3/2006 | Lee et al. ...................... 361/91.1 |
| 8,576,524 B1* | 11/2013 | Zupcau et al. .................. 361/56 |
| 2004/0257728 A1* | 12/2004 | Hu ................... 361/56 |
| 2005/0151200 A1* | 7/2005 | Chen ............................ 257/355 |
| 2009/0110084 A1 | 4/2009 | Cox et al. |
| 2011/0089989 A1 | 4/2011 | Furumiya et al. |
| 2014/0225228 A1* | 8/2014 | Salcedo et al. ................ 257/575 |

FOREIGN PATENT DOCUMENTS

| TW | 200504991 A | 2/2005 |
| TW | 201103119 A | 4/2011 |
| TW | 201115712 A | 5/2011 |

OTHER PUBLICATIONS

International Search Report and Written Opinion for PCT/US2011/059229, mailed Aug. 24, 2012, 6 pages.
International Preliminary Report on Patentability for PCT Application No. PCT/US2011/059229, dated May 15, 2014.

* cited by examiner

*Primary Examiner* — Dharti Patel
(74) *Attorney, Agent, or Firm* — Schwabe Williamson & Wyatt PC (57) ABSTRACT

An electrical overstress (EOS) protection circuit that at least partially neutralizes or compensates for undershoot and overshoot in first and second signals that are communicated using differential signaling, such as with USB communications. For an undershoot, the EOS protection circuit injects charge into pads that receive the first and second signals. For an overshoot, the EOS protection circuit drains charge from the pad that receives the second signal and injects charge into the pad that receives the first signal.

19 Claims, 9 Drawing Sheets

CHARGE INJECTION AND DRAIN-BASED ELECTRICAL OVERSTRESS (EOS) PROTECTION APPARATUS AND METHOD

CROSS REFERENCE TO RELATED APPLICATION

The present application is a national phase entry under 35 U.S.C. §371 of International Application No. PCT/US2011/059229, filed Nov. 3, 2011, entitled "CHARGE INJECTION AND DRAIN-BASED ELECTRICAL OVERSTRESS (EOS) PROTECTION APPARATUS AND METHOD," which designates, among the various States, the United States of America, and the entire contents and disclosures of which are hereby incorporated by reference in their entireties.

TECHNICAL HELD

This disclosure relates generally to electronic circuits. More particularly but not exclusively, the present disclosure relates to a circuit that can reduce undershoot and overshoot in signals that are being communicated.

BACKGROUND INFORMATION

Several techniques are commonly used to communicate electrical signals from a transmitter to a receiver. Differential signaling is often used for such communications, where two complementary signals are sent on two separate wires. Universal Serial Bus (USB) is a common technique/protocol for communicating electrical signals using differential signaling.

A problem that is encountered with differential signaling is overshooting and undershooting of the differentially varying signals, which in turn cause electrical overstress (EOS) on devices that receive the signals. As an illustration, for a chip-to-chip USB serial communication implementation, a transmitter (TX) chip transmits data to a receiver (RX) chip located at some distant place on a circuit board. The on-board connection or communication link(s) between the transmitter and the receiver is through a USB connector, short conductor traces (typically made of copper), a "choke" circuit, long conductor traces, and pads that receive the two differentially varying signals. The rail-to-rail fast rising edges of the two differentially varying signals produce lot of electromagnetic interference (EMI) for nearby circuits or nearby electronic devices. Practically, the common mode of these differentially varying signals is not exactly at $(V_{OH}+V_{OL})/2$, which can therefore lead to higher common mode noise as a source of EMI.

Since the EMI level is often mandated by government regulatory bodies to be below a certain level, the choke circuit is used in the communication link. The choke circuit typically contains mutually coupled inductors, and a feature of the choke circuit is to couple the two differentially varying signals tightly so that their common mode does not vary much and the common mode noise (in the form of EMI) is suppressed. Since the choke circuit is useful in such communication implementations, the choke circuit is often included in the communication link, and itself becomes a source of overshoot and undershoot if one of the signals makes a transition (such as from a high level to a low level, or vice versa) and the other signal does not make a transition. The undershoot is characterized by a downward spike or other significant dip in one or both of the signals, to a lower level of voltage than that produced elsewhere during transmission. The overshoot is characterized by an upward spike or other significant increase in one or both of the signals, to a higher level of voltage than that produced elsewhere during transmission.

This single-edge transition, which generates the overshoot or undershoot, may be observed for example in a single-ended zero (SE0) condition of the USB protocol at an end of packet (EOP) transmission. Generally, as long as the two signals are differential and edges of both signals make a transition simultaneously, overshoot and undershoot during transitions is less likely, due to the mutual coupling provided by the choke circuit. However, in the presence of a single edge (such as at an end of a packet EOP), the inductor(s) in the choke circuit generates kick back and the equivalent RLC tank circuit resonates, thereby giving rise to an under-damped response (e.g., ringing on both signals). This ringing results in severe overshoot and undershoot that can propagate through the long traces and then hit the receiver. The undershoot and overshoot can also affect a tristated transmitter at the receiver end.

Devices (such as drivers, transistors, and other circuitry) at the receiver-end that are connected to one or both pads in the communication link are exposed to the overshoot and undershoot, thereby raising EOS issues. For instance, the devices under EOS may not be designed to handle the voltage levels of the undershoot/overshoot, and so may degrade over time, and the reliability of the individual or overall circuitry is reduced.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Embodiments of an electrical overstress (EOS) protection circuit to at least partially neutralize or otherwise compensate for undershoot and overshoot of signals are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One embodiment provides an electrical overstress (EOS) protection it that can address undershoot and overshoot that may occur under various different scenarios, due to the presence of a choke circuit. A first scenario is if a first signal (referred to herein as a "signal padn") at a first pad (referred to herein as a "pad padn") is low and a second signal (referred to herein as a "signal padp") makes a transition from high to low. This transition results in undershoot at a second pad (referred to herein as a "pad padp" that receives the signal padp) and at the pad padn. A second scenario is if the signal padn is low and the signal padp makes a transition from low to high. This transition results in an overshoot at the pad padp and an undershoot at the pad padn.

Without the EOS protection circuit of one embodiment, devices coupled to one or both pads would be under EOS when the overshoot and undershoot occurs. For instance, the drain-to-gate junction, drain-to-source junction, and drain-to-bulk junctions of one or more transistors coupled to the pad(s) may receive the EOS. One embodiment of the EOS protection circuit reduces the overshoot and undershoot, and minimizes the EOS on drain-to-gate, drain-to-source, and drain-to-bulk junctions.

One embodiment provides an apparatus that includes: an electrical overstress (EOS) protection circuit configured to inject charge in response to an undershoot of first and second signals, and configured to drain charge in response to an overshoot of at least one of the first and second signals.

According to one embodiment of the apparatus, for the undershoot, the EOS protection circuit is configured to inject the charge into pads that respectively receive the first and second signals.

According to one embodiment of the apparatus, for the overshoot: the EOS protection circuit is configured to inject charge into a first pad that receives the first signal; and the EOS protection circuit is configured to drain charge from second pad that receives the second signal.

According to one embodiment of the apparatus, the first and second signals include differentially varying signals of a Universal Serial Bus (USB) protocol.

According to one embodiment of the apparatus, the EOS protection it is configured to inject charge for the undershoot or to drain charge for the overshoot in response to a transition of the second signal from a first level to a second level, while the first signal maintains a current level.

According to one embodiment of the apparatus, the EOS protection it includes: a charge injection and drain circuit configured to receive the first and second signals and having first and second legs configured to inject or drain charge; and a finite state machine coupled to the charge injection and drain circuit, and configured to control timing of injection of charge by the first leg and drain of charge by the second leg in response to the overshoot.

According to one embodiment of the apparatus, the charge injection and drain circuit includes: the first and second legs; an edge detection circuit configured to detect a transition of the second signal from a first voltage level to a second voltage level; a logic circuit coupled to the edge detection circuit and configured to generate a window to inject or drain charge in response to the transition detected by the edge detection circuit; a resistor-capacitor (RC)-based circuit coupled to the logic circuit and configured to control an amount and duration of charge to be injected or drained; and a peak current limiter coupled to the first and second legs and configured to control a peak amount of charge injected or drained by the first and second legs.

According to one embodiment of the apparatus, the FSM includes a Mealy-type FSM.

According to one embodiment of the apparatus, the FSM includes: a detection block to detect a condition in which the second signal transitions to a different level, while the first signal maintains a current level; a counter coupled to the detection block and configured to count cycles in which the condition is maintained, wherein the counter includes a filter to eliminate the condition if the counted cycles is less than a threshold amount of cycles; and a state machine unit coupled to the counter and configured to generate a signal to enable the charge injection and drain circuit, in response to the counted cycles being equal to or greater than the threshold amount of cycles.

According to one embodiment of the apparatus, the EOS protection circuit is configured to generate a window to inject or drain charge, and wherein a start of the window is based on at least one logical operation performed on signals derived from the first and second signals.

One embodiment provides a method that includes: injecting charge, by an electrical overstress (EOS) protection circuit, in response to an undershoot condition associated with first and second signals; and draining charge, by the EOS protection circuit, in response to an overshoot condition associated with the second signal.

According to one embodiment, the method further includes in response to the overshoot condition associated with the second signal, injecting charge, by the EOS protection circuit, in response to another undershoot condition associated with the first signal.

According to one embodiment of the method, the injecting charge includes injecting charge into first and second pads that respectively receive the first and second signals, and wherein the draining charge includes draining charge from the second pad that receives the second signal.

According to one embodiment, the method further includes controlling a duration and amount of the draining of the charge using a finite state machine.

According to one embodiment, the method further includes using logical operations on signals derived from the first and second signals to determine a start of a window to inject or drain charge.

One embodiment provides a system that includes: a receiver at a receiver end; a communication link between a transmitter end and the receiver end, and configured to carry first and second signals using differential signaling; and an electrical overstress (EOS) protection circuit located at the receiver end, and configured to inject charge in response to an undershoot condition in the communication link, and configured to drain charge in response to an overshoot condition in the communication link.

According to one embodiment of the system, the EOS protection it is configured to drain charge from or inject charge into one or both of the first and second signals.

According to one embodiment of the system, the undershoot condition corresponds to transition of the second signal from a high level to a low level while the first signal remains at the low level, and wherein the overshoot condition corresponds to a transition of the second signal from the low level to the high level while the first signal remains at the low level.

According to one embodiment of the system, the EOS protection circuit is configured to inject or drain charge to enable at least one device coupled to the communication link to obtain a charge profile in response to the undershoot or overshoot condition.

Figure 1:
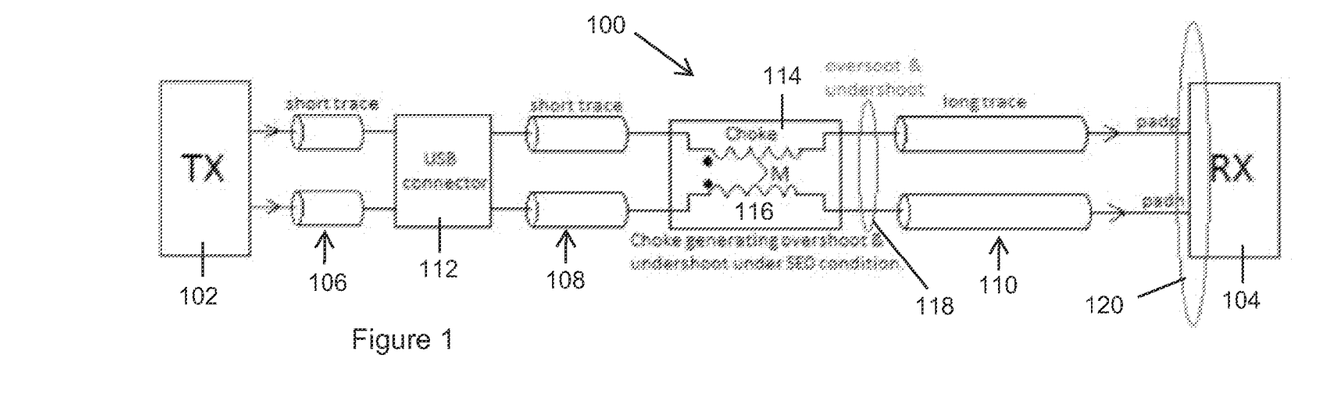
FIG. 1 illustrates a communication link of a subsystem in which an EOS protection circuit can be implemented in accordance with one embodiment.

FIG. 1 illustrates a subsystem 100 in which one embodiment of the EOS protection circuit can be implemented. The subsystem 100 may comprise, for example, parts of the communication link for USB transmission/reception. Other forms of communication, other than USB, may be used by the subsystem 100.

The subsystem 100 includes a transmitter (TX) 102 at a transmitter end, and a receiver (RX) 104 at a receiver end. The transmitter 102 and the receiver 104 may be located on the same chip or circuit board or may be located at distant/separated chips or boards.

in one embodiment, the transmitter 102 and the receiver 104 may communicate with each other using differential signaling. As such, two separate wires (or signal paths) may be provided to respectively carry a first signal padn and a second signal padp, such as via respective short traces 106 and 108 and respective long traces 110. A USB connector 112 may be coupled between the short traces 106 and 108. In one embodiment, a choke circuit 114 may be coupled between the short traces 108 and the long traces 110. The choke circuit 114 may include a pair of mutually coupled inductors 116 to tightly couple the first and second signals.

As previously explained above, under a SE0 condition or other single-edge condition wherein one of the two signals transitions and the other of the two signals does not, the choke circuit 114 may generate undershoot and/or overshoot (generally represented at 118 in FIG. 1) in either or both of the two signals padn and padp. The overshoot and undershoot travel through the long traces 110 and may cause EOS (generally shown at 120) at devices coupled to pads that respectively receive the signals padn and padp. Accordingly, one embodiment provides an EOS protection circuit at the receiver end (such as at the receiver 104) to inject charge into the pads so as to compensate for an undershoot or to drain charge from one of the pads so as to compensate for an overshoot.

Figure 2:
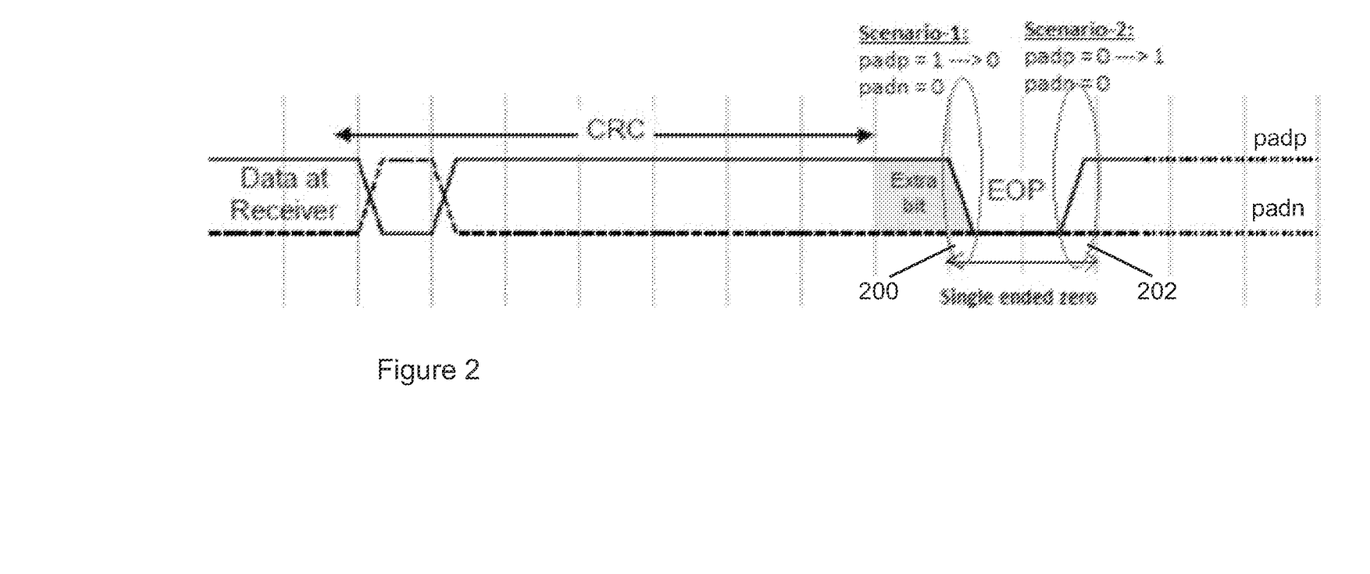
FIG. 2 illustrates example first and second scenarios in which signals may generate undershoot and overshoot.

FIG. 2 shows example first and second scenarios that may cause undershoot and overshoot to be generated, and which an embodiment of the EOS protection circuit can reduce or otherwise compensate for. In the first scenario (labeled "Scenario-1") at 200, the signal padp transitions from high to low while the signal padn remains low. In the second scenario (labeled "Scenario-2") at 202, the signal padp transitions from low to high while the signal padn remains low. These two scenarios generally involve single-ended zero (SE0) conditions such as encountered at end of packet (EOP) transmission under the USB protocol. The resulting signals padn and padp having the undershoot/overshoot may be received at pads at the receiver 104.

Figure 3:
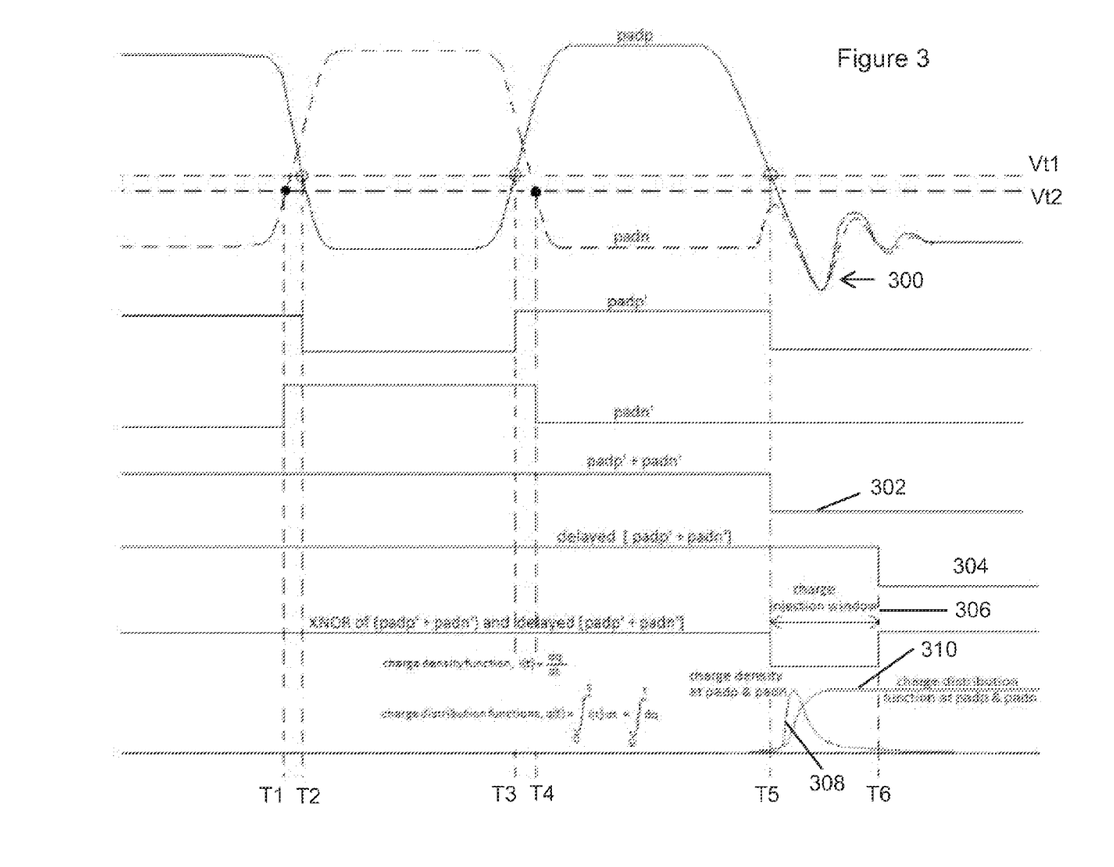
FIG. 3 illustrates signal timing diagrams in accordance with operation of an embodiment of an EOS protection circuit for the first scenario from FIG. 2.

FIG. 3 illustrates signal timing diagrams in accordance with operation of an embodiment of the EOS protection circuit for the first scenario from FIG. 2, in which the signal padp goes from high to low while the signal padn remains low, thereby generating an undershoot 300. The undershoot 300 may be received at the pad padn and at the pad padp at the receiver 104, thereby potentially causing EOS at devices coupled to such pads, if the EOS protection circuit is not otherwise present.

In one embodiment, first and second detectors may be provided to detect transitions of the signals padn and padp from low to high, or vice versa. For instance, a transition of the signal padn from low to high is detected at time T1, and a transition of the signal padp from high to low is detected at time T2. Similarly, a transition of the signal padn from high to low is detected at time T4, and a transition of the signal padp from low to high is detected at time T3. The transitions at the times T1-T4 represent the double-ended (as opposed to single-ended) transitioning during normal differential signaling.

At a time T5, for instance in the SE0 state (in the full speed or FS mode) of the USB protocol, the signal padn is low and the signal padp transitions from high to low for an end of packet (EOP). This single-edge transition at the time T5 causes the undershoot 300 on the signals padp and padn and the undershoot 300 appears on the pads that receive these signals.

In one embodiment, two different low threshold detectors to detect threshold values Vt1 and Vt2 may be used to respectively detect the signals padp and padn going low or otherwise transitioning, such as at times T1-T5. In FIG. 3, the inverted outputs of these detectors (shown and described later below) are labeled as the signals padp' and padn', which transition from low to high or from high to low as shown in FIG. 3 in response to the detected transitions of the signals padn and padp at times T1-T5.

The OR logic result (labeled as the signal "padp' padn'" 302 in FIG. 3) of these signals padp' and padn' has a logic low level if the signal padn is low and the signal padp makes a transition from high to low (e.g., crosses the low threshold level Vt1) at the time T5. The inverse exclusive OR (XNOR) logic of this signal 302 with its delayed version (signal 304) creates a window 306 for charge injection. The window 306 may have a duration, for example, from time T5 to time T6.

In one embodiment, a charge injection and drain circuit (described later below) of the EOS protection circuit is enabled during the window 306 to inject a controlled amount of charge 308 into the signals padp and padn and/or into the pads that receive the signals padn and padp, so as to at least partially neutralize the pads to thereby reduce or otherwise compensate for the undershoot 300. In an embodiment, a total amount of the injected charge 308 can be found by integrating a charge density function, having for example the following equation:

$$i(t) = dq/dt$$

This relationship can also be represented by a charge distribution function with respect to time, having for example the following equation:

$$q(t) = \int_0^t i(t)dt = \int_0^t dq$$

The final steady state value of this charge distribution function is the total amount of charge injected, such as shown at 310 in FIG. 3. The total amount of charge can be represented by the following equation:

$$\text{Total charge injected/drained} = \int_0^\infty i(t)dt = \int_0^\infty dq$$

Figure 4:
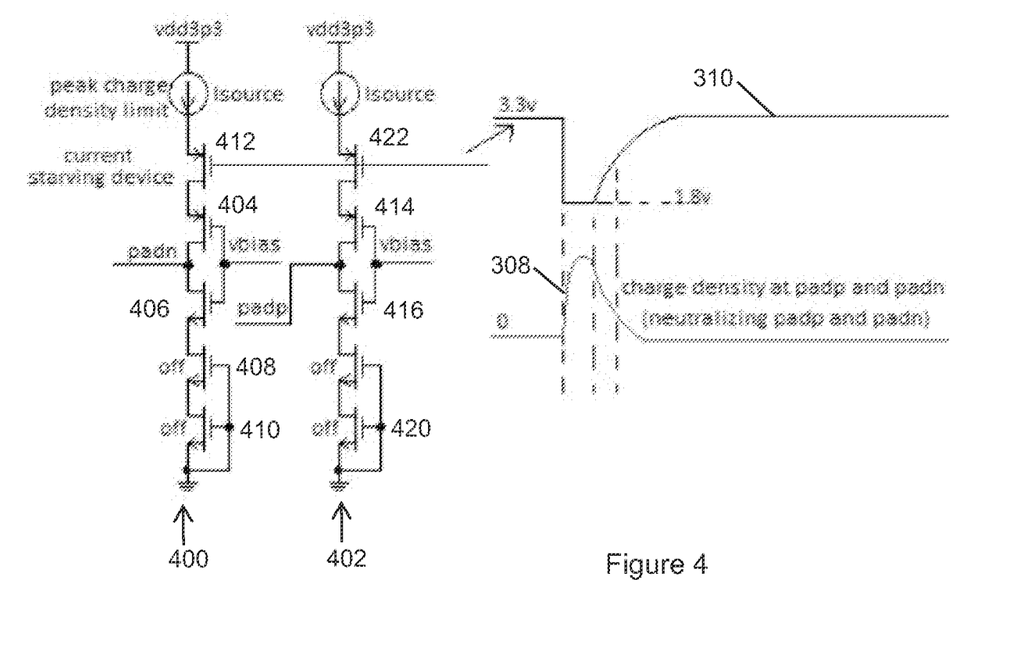
FIG. 4 illustrates charge injection legs to inject charge for an undershoot in the first scenario in accordance with one embodiment.

FIG. 4 illustrates charge injection legs 400 and 402 to inject the charge 308 for the undershoot 300 in the first scenario of FIG. 3 in accordance with one embodiment. The leg 400 is coupled to the pad padn that receives the signal padn and includes a plurality of transistors 404-412. The transistors 406, 408, and 410 may be N-type complementary metal oxide (NMOS) transistors, while the transistors 404 and 412 may be P-type MOS (PMOS) transistors. The transistors 404 and 406 may have drain terminals coupled to receive the signal padn. The transistors 404 and 406 in turn may have gate terminals coupled to receive a signal vbias. The transistor 406 has a source terminal coupled to a drain terminal of the transistor 408, and the transistor 408 in turn has a source terminal coupled to a drain terminal of the transistor 410. The transistor 410 has a source terminal and a gate terminal coupled to ground, and the gate terminal of the transistor 408 is also coupled to ground.

The transistor 404 has a source terminal coupled to a drain terminal of the transistor 412. A constant current source Isource is coupled between a voltage supply vdd3p3 and a source terminal of the transistor 412. The transistor 412 of one embodiment may be a "current-starved device" that would control the injected charge during the undershoot 300. In one embodiment, the charge 308 is injected into the signal padn that receives the undershoot 300.

In one embodiment during charge injection, the transistors 408 and 410 are turned OFF (so as to be highly ohmic), thereby preventing the charge 308 from flowing to ground and instead enables the charge 308 to flow to signal padn through the transistor 412. Furthermore in one embodiment, the total amount of injected charge can be controlled by the length of the window 306 and by the current source Isource operating as a peak current limiter that limits the peak charge density for controlled power consumption, such as to minimize power consumption. Still further in one embodiment, the exact nature of the charge density may be controlled by controlling rise and fall slew at the input (gate terminal) of the current-starved device (the transistor 412). This input may be exponential in nature (as shown at 310 for example) and may in one embodiment be derived from an output of a resistor-capacitor (RC)-based circuit described later below.

The leg 402 is coupled to the pad that receives the signal padp and includes a plurality of transistors 414-422 and the current source Isource. The transistors 414-422 are coupled similarly to the transistors 404-412 in the leg 400, and so will not be described in further detail herein. During charge injection for the first scenario involving the undershoot 300, the charge 308 is injected into the signal padp and/or into the pad that receives the signal padp, so as to serve the transistor 422 that is a current-starved device.

Accordingly by injecting the charge 308 into the pads that receive the signals padn and padp and/or into these signals themselves, the amount of the undershoot 300 may be reduced in the first scenario.

Figure 5:
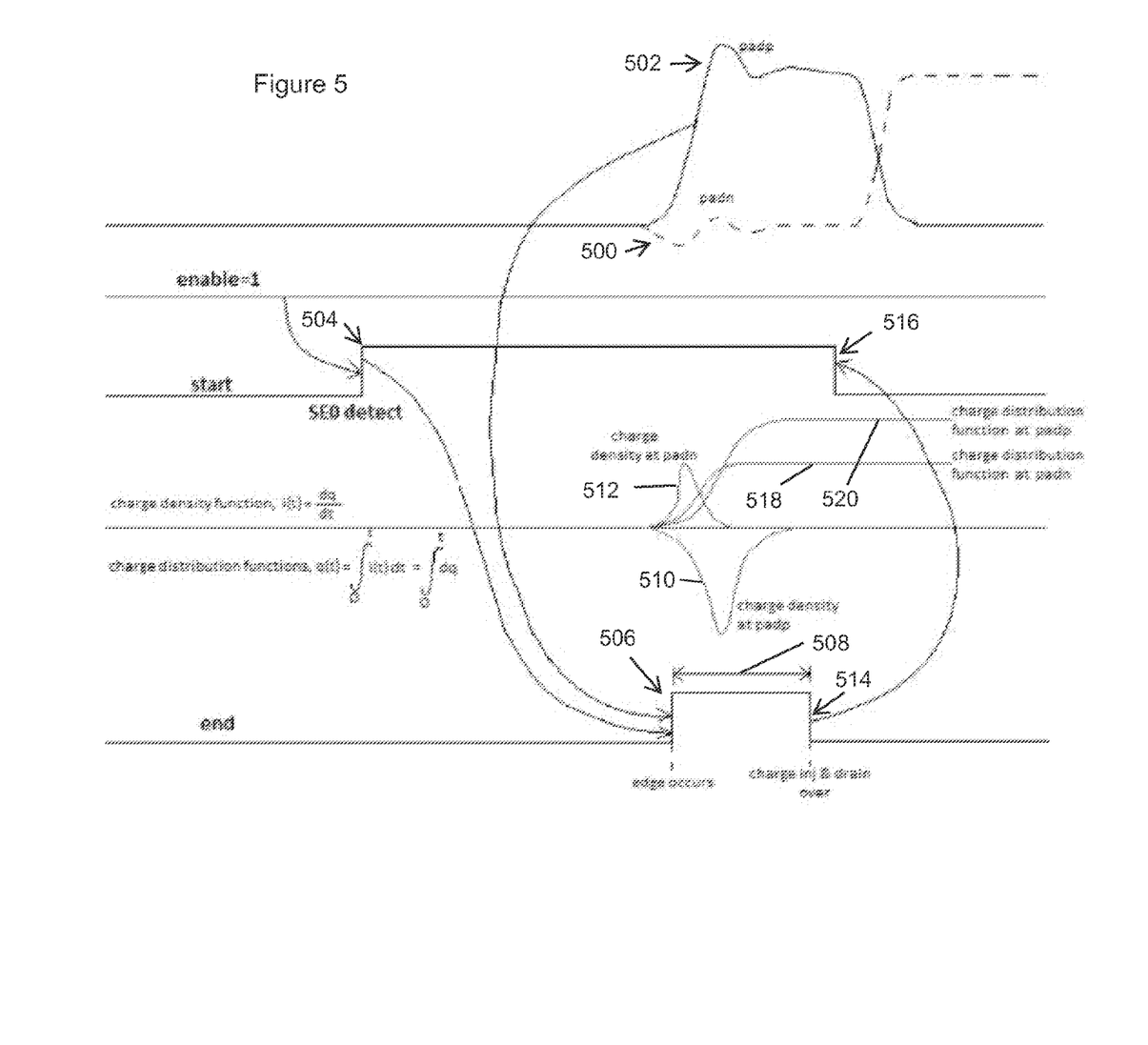
FIG. 5 illustrates signal timing diagrams in accordance with operation of an embodiment of an EOS protection circuit for the second scenario from FIG. 2.

FIG. 5 illustrates signal timing diagrams in accordance with operation of an embodiment of the EOS protection circuit for the second scenario from FIG. 2, in which the signal padp transitions from low to high while the signal padn remains low, thereby resulting in an undershoot 500 for the signal padn and an overshoot 502 for the signal padp. According to one embodiment, a finite state machine (FSM) of the EOS protection detects the SE0 condition of the USB protocol where a single-edge transition occurs at the beginning of packet. Upon SE0 state detection, the FSM asserts/transitions to high a signal "start" at 504. This signal start enables the charge injection and drain circuit described later below.

The charge injection and drain circuit detects the rising edge on the signal padp and asserts/transitions to high a signal "end" at 506. During a window 508, a controlled amount of charge 510 is drained from the pad receiving the signal padp and charge 512 is injected into the pad receiving the signal padn, so as to reduce the overshoot 502 and the undershoot 500 respectively.

Once the charge injection and drain action is over, the FSM asserts/transitions to low the signal end at 514. This transition at 514 in turn causes the signal start to go low at 526, thereby disabling the charge injection and drain circuit. As previously above with the equations for the first scenario, the total amount of charge injected/drained for this second scenario can be found by integrating the charge density function, which can also be represented as a charge distribution function with respect to time. The final steady state value of this function may be the total amount of charge injected and drained as respectively shown at 518 and 520 in FIG. 5.

Figure 6:
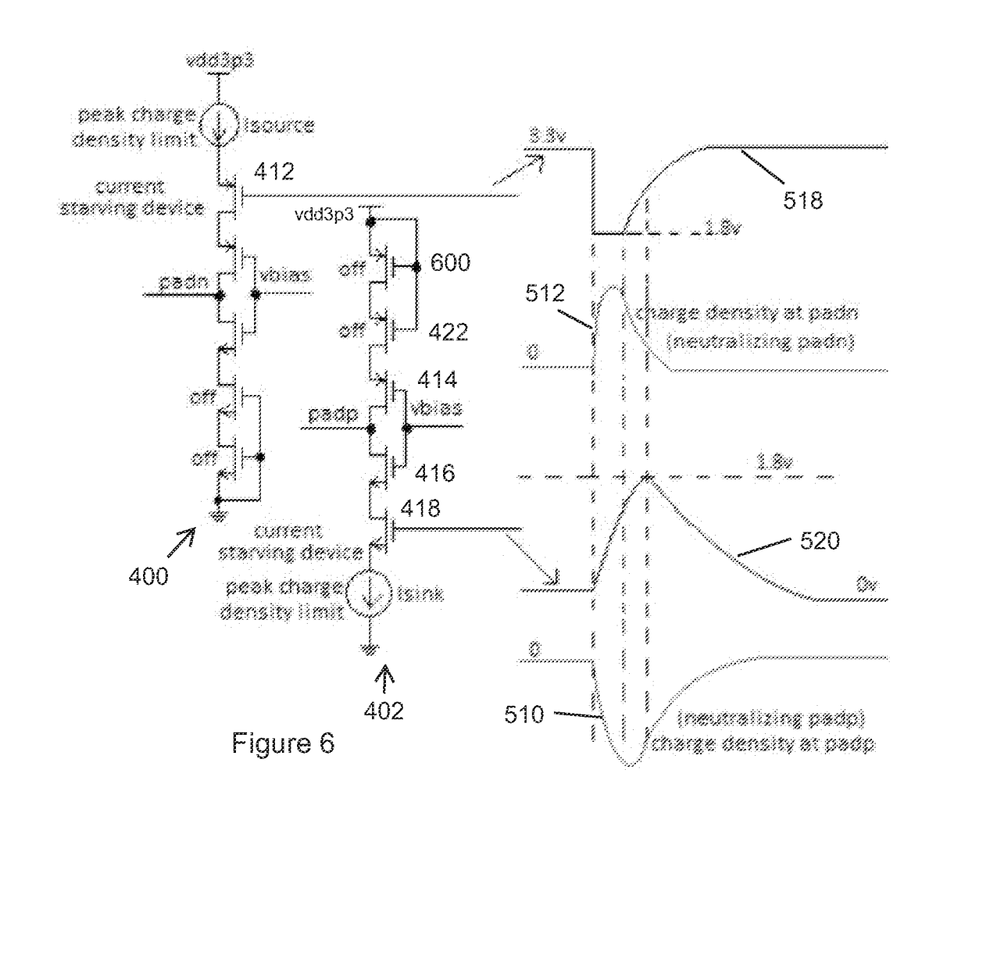
FIG. 6 illustrates charge injection and drain legs to respectively inject charge for an undershoot and drain charge for an overshoot in the second scenario in accordance with one embodiment.

FIG. 6 illustrates the legs 400 and 402 to respectively inject the charge 512 for the undershoot 500 and the drain the charge 510 for the overshoot 502 in the second scenario of FIG. 5 in accordance with one embodiment. The leg 400 in FIG. 6 (for the signal padn) is similarly configured as in FIG. 4 to receive the charge injection 512 at the pad padn, and so will not be further described herein.

For the leg 402 in FIG. 6 (for the signal padp), the transistor 422 is turned OFF and the current source Isource is switched out of the leg 402 and a turned OFF transistor 600 is switched into the leg 402. The turned ON transistor 418 represents a current-starved device, which in turn is coupled to a current sink Isink that drains to ground.

The total amount of charge injected/drained in FIG. 6 can be respectively controlled by the current source Isource and the current sink Isink both operating as a peak current limiter to limit the peak charge density for controlled power consumption, and also controlled by sizing the length of the window 508. The exact nature of charge density may be controlled by controlling rise and fall slew inputs into gate terminals of the current-starved devices (the transistors 412 and 418). This input into each of the gate terminals may be exponential in nature (such as shown at 518 and 520) and may be derived from and adjusted by the charging and discharging output of the RC-based circuit described later below.

Figure 7:
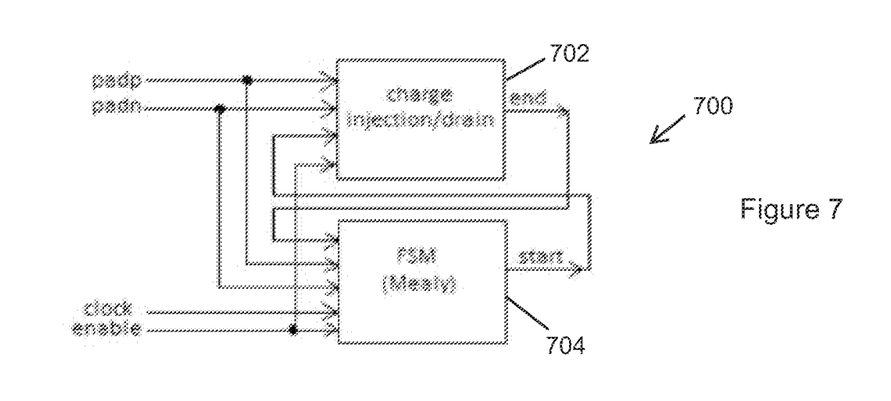
FIG. 7 is a block diagram of an EOS protection circuit in accordance with one embodiment.

FIG. 7 is a block diagram of an EOS protection circuit 700 in accordance with one embodiment. The EOS protection circuit 700 includes a charge injection and drain circuit 702 coupled to a finite state machine (FSM) 704. In one embodiment, the EOS protection circuit 700 may be located at the receiver end, such as part of the receiver 104 in FIG. 1. In other embodiments, the EOS protection circuit 700 may be located elsewhere in the subsystem 100 of FIG. 1.

As shown in FIG. 7, the signals padn and padp are provided as inputs to the EOS protection circuit 700 and to the FSM 704. The FSM 704, which may be a Mealy-type FSM in one embodiment, further receives a signal "enable" and a signal "clock" signal as inputs. The FSM 704 provides the signal start as an input to the charge injection and drain circuit 702, which also receives the signal enable as an input. The charge injection and drain circuit 702 provides the signal end as an input to the FSM 704.

Figure 8:
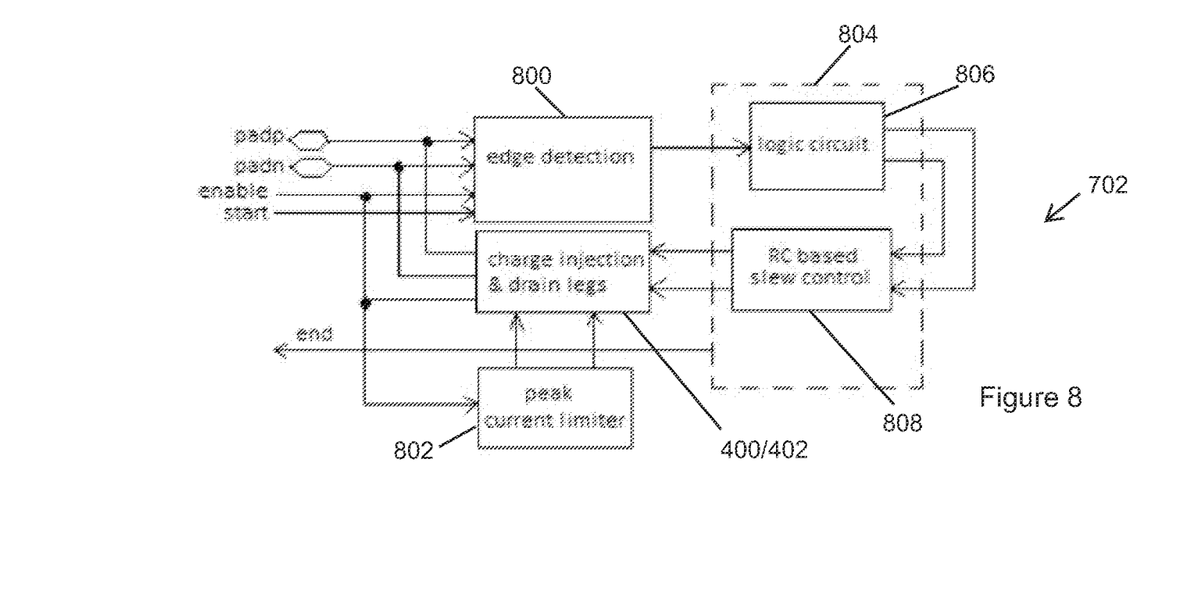
FIG. 8 is a block diagram of a charge injection and drain circuit for the EOS protection circuit of FIG. 7, in accordance with one embodiment.

FIG. 8 is a block diagram showing the charge injection and drain circuit 702 of one embodiment in more detail. The charge injection and drain circuit 702 includes an edge detection circuit 800, a peak current limiter 802, a circuit block 804, and the charge injection and drain legs 400 and 402 (shown and described in FIGS. 4 and 6), all coupled together. The edge detection circuit 800 has input terminals coupled to a pad padn (which receives the signal padn) and to a pad padp (which receives the signal padp). The legs 400 and 402 also have output terminals coupled to the pad padn and to the pad padn.

The signal enable is provided as an input to the edge detection circuit 800, to the legs 400 and 402, and to the peak current limiter 802. The peak current limiter 802 includes circuitry for the current source Isource and current sink Isink. The circuit block 804 includes a logic circuit 806 and an RC-based slew control circuit 808 that includes the RC-based circuit discussed above with respect to FIGS. 4 and 6.

The edge detection circuit 800 provides its output(s) to the circuit block 804. More particularly in one embodiment, the edge detection circuit 800 provides the signals padp' and padn' to the logic circuit 806. The logic circuit 806 in turn provides its output as inputs to the RC-based slew control circuit 808. The RC-based slew control circuit 808 then provides its output to the legs 400 and 402 so as to provide the charge profiles shown and described previously above. The circuit block 804 also outputs the signal end that is provided to the FSM 704.

Figure 9:
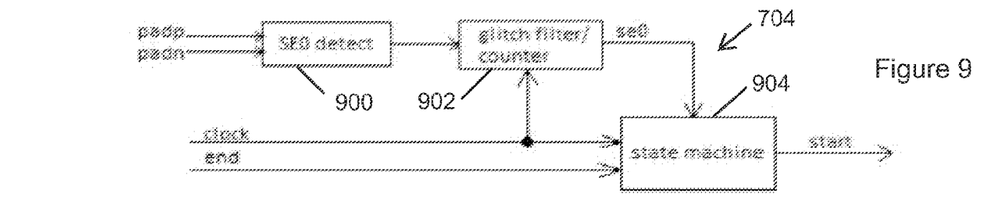
FIG. 9 is a block diagram of a finite state machine (FSM) for the EOS protection circuit of FIG. 7, in accordance with one embodiment.

FIG. 9 is a block diagram of the FSM 704 in more detail in accordance with one embodiment. The FSM 704 includes an SE0 detection block 900 coupled to receive the signals padn and padp, which may be stepped-down versions, so as to detect single ended transitions therein, for example as shown in FIGS. 2 and 5. The SE0 detection block 900 provides its output to a glitch/filter counter 902, which in turn provides an output signal se0 as input to a state machine unit 904. The signal clock is provided to the glitch/filter counter 902 and to the state machine unit 904. The signal end (from the charge injection and drain circuit 702) is also provided as input to the state machine unit 904, and the state machine unit 904 outputs the signal start provided to the charge injection and drain circuit 702.

In operation and with further reference to what is shown and described with respect to FIG. 5 above for the second scenario, once the charge injection and drain action is over at 514, the signal end is generated by the charge injection and drain circuit 702 and provided to the state machine unit 904. The state machine unit 904 detects this signal end and de-asserts the signal start at 516 to disable the charge injection and drain circuit 702.

In one embodiment, the glitch/filter counter 902 of the FSM 704 uses a 2-bit counter to make sure that the single-ended zero detected by the SE0 detection block 900 is indeed an SE0 state (e.g., padp=padn=0 is detected for at least 3 clock cycles as a threshold amount of cycles, for instance) and not a glitch. A 2-bit counter may be used in this example of the glitch/filter counter 902 to count clock pulses until the count equals or is greater than binary 11 corresponding to 3 cycles. This counting ensures that padp=padn=0 for a sufficient length of time and indeed corresponds to an SE0 state, thereby eliminating glitches (which would otherwise occur if the counted cycles is less than the threshold amount of cycles) and avoiding false SE0 detection. Once an SE0 state is confirmed by the glitch/filter counter 902, the state machine unit 904 may perform handshaking and controlling of the charge injection and drain circuit 702.

Figure 10:
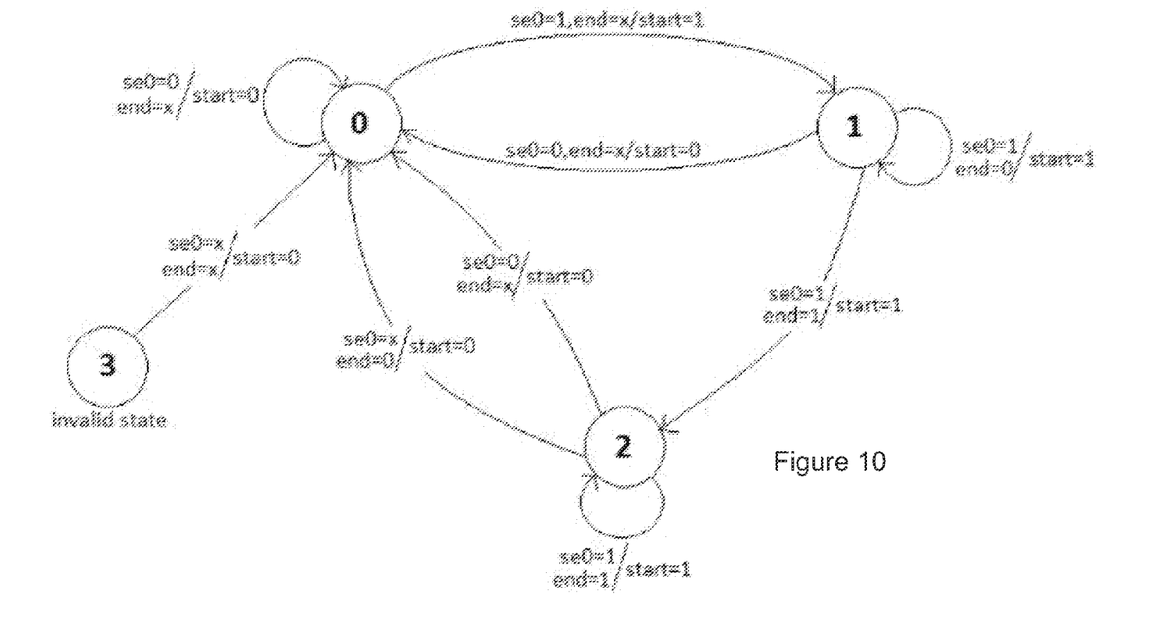
FIG. 10 is a state diagram for the FSM of FIG. 9 in accordance with one embodiment.

FIG. 10 is a state diagram for the state machine unit 904 of the FSM 704 of FIG. 9 in accordance with one embodiment. The state machine unit 904 has two inputs (the signal se0 and the signal end) and four states (states 0, 1, 2, and 3) with the state 3 being an invalid state. The output of the state machine unit 904, which is the signal start that can assume a value of binary 1 or binary 0, depends upon the present state and the present inputs in a Mealy-type state machine.

There is a possibility of the state machine unit 904 entering into the invalid state 3 due to glitch/noise or power ramp up. Under such circumstances, the state machine unit 904 brings itself back to the valid state 0 from invalid state 3 as shown in FIG. 10.

In one embodiment, the state machine unit 904 asserts as high the signal start (start=1) only when the SE0 state (SE0=1, and padn=padp=0) is detected by the SE0 detection block 900. This corresponds to states 1 and 2 in FIG. 10. The state machine unit 904 de-asserts the signal start (start=0) when signal end goes low (end=0) after completion of the charge injection and charge drain. This corresponds to the transition to state 0 in FIG. 10.

Figure 11:
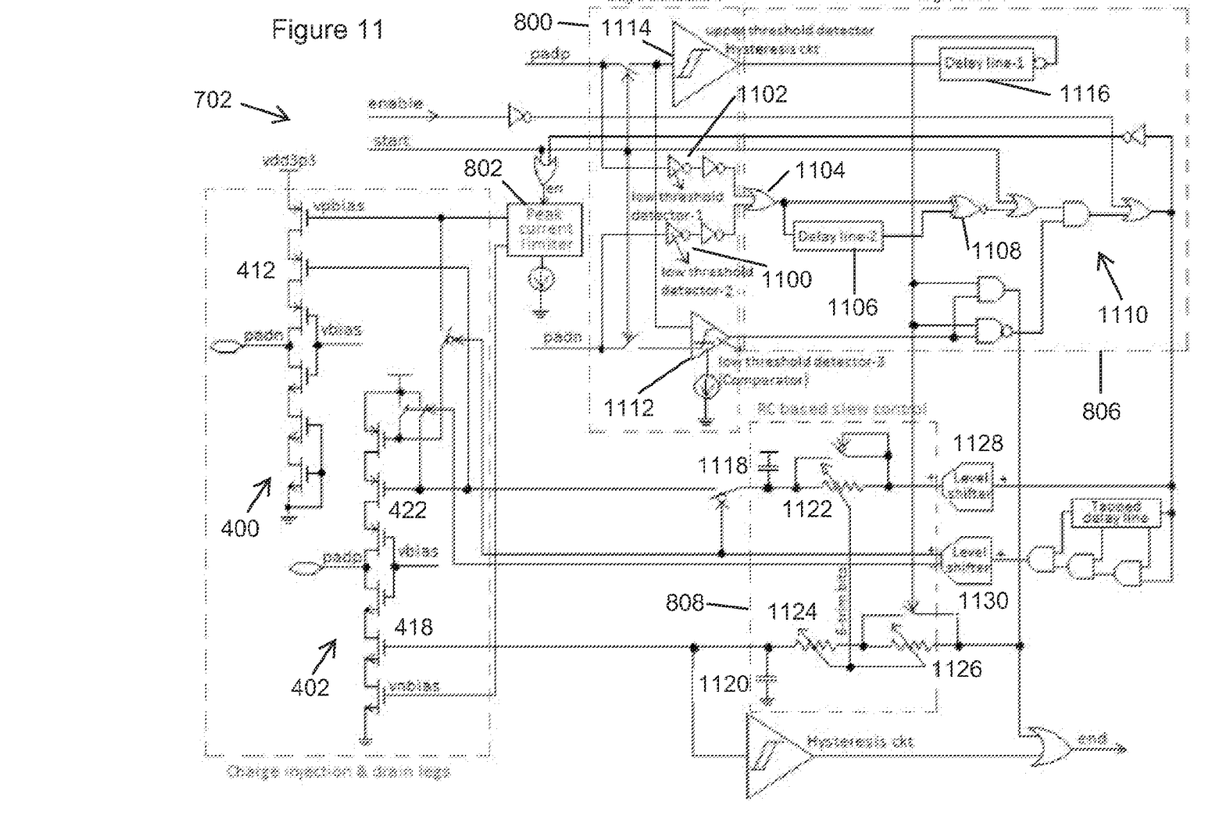
FIG. 11 is a circuit schematic diagram of the charge injection and drain circuit of FIG. 8 in accordance with one embodiment.

FIG. 11 is a circuit schematic diagram of the charge injection and drain circuit 702 of FIG. 8 in more detail in accordance with one embodiment. The embodiment of FIG. 8 is intended to be an example of the types of circuitry and connections that may be provided in the charge injection and drain circuit 702. Other embodiments may use other types of circuitry and connections.

With respect to the first scenario wherein the signal padn is low and the signal padp transitions from high to low, the voltage levels of these two signals are respectively detected by low threshold detectors 1100 and 1102. The low threshold detectors 1100 and 1102 of one embodiment include inverter circuitry tuned to certain threshold values, such as voltage values that are very low. The detector 1102 for the signal padp has the threshold value of Vt1 and the detector for the signal padn has the threshold value of Vt2. Here, Vt2 may be designed to be less than Vt1, such as depicted in FIG. 3.

The output of these detectors 1100 and 1102 goes low (or otherwise changes state) when the input signal goes above these threshold values Vt1 or Vt2. The signals padn' and padp' are the respective inverted outputs of these detectors 1100 and 1102, such as shown in FIG. 3. The signals padp' and padn' are input into an OR gate 1104, and the OR logic result of these signals padp' and padn' goes low when padn is low and padp goes low (crosses the threshold Vt1 as shown in FIG. 3).

A delay line 1106 and an XNOR gate 1108 are coupled to receive the output of the OR gate 1104. The delay line 1106 is configured to delay the OR logic result of the signals padp' and padn', and to then provide this delayed signal as input to the XNOR gate 1108, which also receives as input the OR logic result of the signals padp' and padn'. The XNOR logic result of the OR logic result of the signals padp' and padn' with its delayed version generates a binary low output. As shown in FIG. 3, this is the window 306 where the charge injection and drain circuit 702 is enabled (via logic gates 1110 and other circuitry and signals), and charge injection into the pad padp and into the pad padn is performed (via the peak current limiter circuit 802 and the RC-based slew control circuit 808) to at least partially neutralize these pads, thereby reducing the undershoot.

With respect to the second scenario wherein the signal padp goes from low to high while the signal padn remains low, if the charge injection and drain circuit 702 is enabled, a comparator 1112 detects the rising edge of the signal padp by detecting the lower threshold of the edge. The output of the comparator 1112 goes high if the rising edge occurs on the signal padp. In one embodiment, this comparator 1112 has a folded cascode architecture with differential inputs and a single-ended output, with stepped-down versions of the signals padp and padn being the inputs to this comparator 1112.

The upper threshold of the rising edge on the signal padp may be detected by a hysteresis circuit 1114 that receives the signal padp as input. The upper threshold detection is used in one embodiment due to the large range of rise time in full speed (FS) mode of the USE protocol. For instance, the rise time can be from 4 ns to 20 ns in FS mode of USB. These threshold circuits provided by the comparator 1112 and the hysteresis circuit 1114 help to create the window 508 for charge injection and drain.

In one embodiment, an inverter-based delay line 1116 is coupled to receive the output of the hysteresis circuit 1114 and may be used to stretch the duration of the window 508 further by some margin, for instance since overshoot may last for approximately 5 ns on the pad padp after the upper threshold detection is performed by the hysteresis circuit 1114. When the output of the delay line 1116 goes zero, then charge draining is over.

The input signal slew for current-starved devices (e.g., the transistors 412, 422, and 418) may be adjusted by outputs of RC-based charging and discharging circuitry contained in the RC-based slew control circuit 808, thereby enabling the charge injection/drain density profile to be governed by RC time constants. In one embodiment of the RC-based slew control circuit 808, the RC-based circuitry may be provided by capacitors 1118 and 1120 implemented with MOS capacitors and resistors 1122, 1124, and 1126 implemented with poly resistors. If the poly resistors have large variation (for example a variation of approximately 52%), a six-bit calibration code may be applied to calibrate them, thereby improving the precision of the charging and discharging time bases generated by the RC-based circuitry.

In one embodiment, the charge injection and drain circuit 702 may use level shifters 1128 and 1130 to shift input signaling levels to certain voltage levels for PMOS devices in the charge injection legs 400 and 402. This level shifting may be used, for instance, if the PMOS devices operate in certain voltage ranges.

Figure 12:
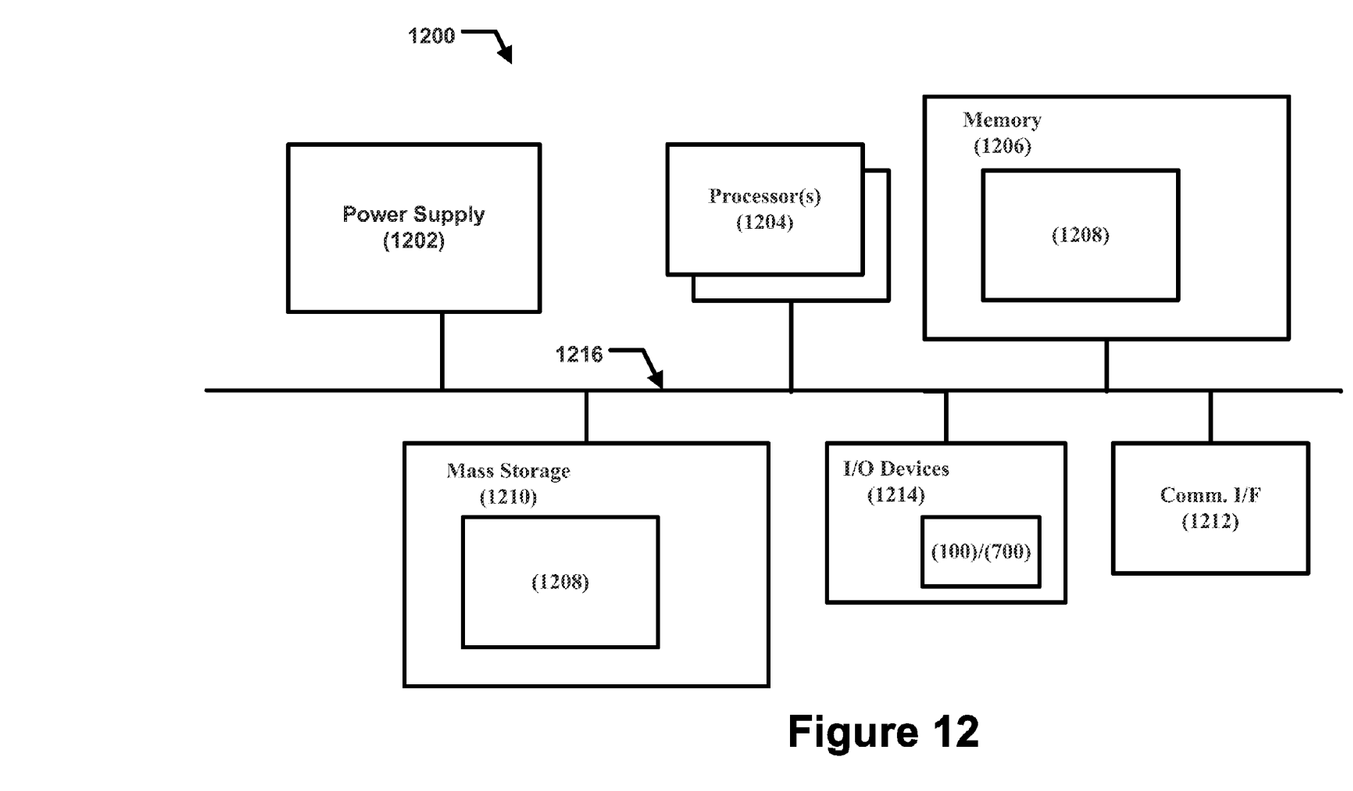
FIG. 12 is a block diagram that illustrates an example computer system suitable to practice the disclosed EOS protection circuit and method of various embodiments.

Embodiments of the EOS protection circuit 700 described herein may be used in a number of implementations and applications. For example, mobile devices, including but not limited to smart phones, nettops or laptops, tablets and other Mobile Internet Devices (MIDs) may use differential signaling in some embodiments. FIG. 12 is a block diagram that illustrates an example computer system 1200 suitable to practice the disclosed EOS protection circuit 700 and method of operation thereof according to various embodiments.

As shown, the computer system 1200 may include a power supply unit 1202, a number of processors or processor cores 1204, a system memory 1206 having processor-readable and processor-executable instructions 1208 stored therein, a mass storage device 1210 that may also store the instructions 1208, and a communication interface 1212. For the purpose of this application, including the claims, the terms "processor" and "processor cores" may be considered synonymous, unless the context clearly requires otherwise.

The one or more mass storage devices 1210 and/or the memory 1206 may comprise a tangible, non-transitory computer-readable storage device (such as a diskette, hard drive, compact disc read only memory (CDROM), hardware storage unit, and so forth). The computer system 1200 may also comprise input/output devices 1214 (such as a keyboard, display screen, cursor control, and so forth). In various embodiments and purely by way of example, the I/O devices 1214 and/or related circuitry may include the subsystem 100 having the EOS protection circuit 700. The subsystem 100 having the EOS protection it 700 may alternatively or additionally be located elsewhere in the computer system 1200, such as at the communication interface 1212, and may comprise part or all of an integrated circuit.

The various elements of FIG. 12 may be coupled to each other via a system bus 1216, which represents one or more buses. In the case of multiple buses, they may be bridged by one or more bus bridges (not shown). Data may pass through the system bus 1216 through the I/O devices 1214, for example, via the subsystem 100.

The system memory 1206 and the mass storage device 1210 may be employed to store a working copy and a permanent copy of the programming instructions implementing one or more operating systems, firmware modules or drivers, applications, and so forth, herein collectively denoted as 1208. The permanent copy of the programming instructions may be placed into permanent storage in the factory, or in the field, through, for example, a distribution medium (not shown), such as a compact disc (CD), or through the communication interface 1212 (from a distribution server (not shown)).

According to various embodiments, one or more of the depicted components of the system 1200 and/or other element(s) may include a keyboard, LCD screen, non-volatile memory port, multiple antennas, graphics processor, application processor, speakers, or other associated mobile device elements, including a camera.

The remaining constitution of the various elements of the computer system 1200 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of high/low values of signals, responses to rising/falling edges of signals, inverters to invert signals, P-type and N-type transistors, and so forth. In other embodiments, different configurations can be provided in view of whether N-type transistors are used instead of P-type transistors, whether or not certain signals are inverted, whether certain changes in state are triggered in response to falling edges instead of rising edges or vice versa, and so forth.

These and other modifications can be made in light of the above detailed description. The terms used in the following claims should not be construed to be limited to the specific embodiments disclosed in the specification.

What is claimed is:

1. An apparatus, comprising:
an electrical overstress (EOS) protection circuit configured to inject charge in response to an undershoot of first and second signals, and configured to drain charge in response to an overshoot of at least one of the first and second signals.

2. The apparatus of claim 1, wherein for the undershoot, the EOS protection circuit is configured to inject the charge into pads that respectively receive the first and second signals.

3. The apparatus of claim 1, wherein for the overshoot:
the EOS protection circuit is configured to inject charge into a first pad that receives the first signal; and
the EOS protection circuit is configured to drain charge from a second pad that receives the second signal.

4. The apparatus of claim 1, wherein the first and second signals include differentially varying signals of a Universal Serial Bus (USB) protocol.

5. The apparatus of claim 1, wherein the EOS protection circuit is configured to inject charge for the undershoot or to drain charge for the overshoot in response to a transition of the second signal from a first level to a second level, while the first signal maintains a current level.

6. The apparatus of claim 1, wherein the EOS protection circuit includes:
a charge injection and drain circuit configured to receive the first and second signals and having first and second legs configured to inject or drain charge; and
a finite state machine (FSM) coupled to the charge injection and drain circuit, and configured to control timing of injection of charge by the first leg and drain of charge by the second leg in response to the overshoot.

7. The apparatus of claim 6, wherein the charge injection and drain circuit includes:
the first and second legs;
an edge detection circuit configured to detect a transition of the second signal from a first voltage level to a second voltage level;
a logic circuit coupled to the edge detection circuit and configured to generate a window to inject or drain charge in response to the transition detected by the edge detection circuit;
a resistor-capacitor (RC)-based circuit coupled to the logic circuit and configured to control an amount and duration of charge to be injected or drained; and
a peak current limiter coupled to the first and second legs and configured to control a peak amount of charge injected or drained by the first and second legs.

8. The apparatus of claim 6, wherein the FSM includes a Mealy-type FSM.

9. The apparatus of claim 6, wherein the FSM includes:
a detection block to detect a condition in which the second signal transitions to a different level, while the first signal maintains a current level;
a counter coupled to the detection block and configured to count cycles in which the condition is maintained, wherein the counter includes a filter to eliminate the condition if the counted cycles is less than a threshold amount of cycles; and
a state machine unit coupled to the counter and configured to generate a signal to enable the charge injection and drain circuit, in response to the counted cycles being equal to or greater than the threshold amount of cycles.

10. The apparatus of claim 1, wherein the EOS protection circuit is configured to generate a window to inject or drain charge, and wherein a start of the window is based on at least one logical operation performed on signals derived from the first and second signals.

11. A method, comprising:
injecting charge, by an electrical overstress (EOS) protection circuit, in response to an undershoot condition associated with first and second signals; and
draining charge, by the EOS protection circuit, in response to an overshoot condition associated with the second signal.

12. The method of claim 11, further comprising in response to the overshoot condition associated with the second signal, injecting charge, by the EOS protection circuit, in response to another undershoot condition associated with the first signal.

13. The method of claim 11, wherein the injecting charge includes injecting charge into first and second pads that respectively receive the first and second signals, and wherein the draining charge includes draining charge from the second pad that receives the second signal.

14. The method of claim 11, further comprising controlling a duration and amount of the draining of the charge using a finite state machine.

15. The method of claim 11, further comprising using logical operations on signals derived from the first and second signals to determine a start of a window to inject or drain charge.

16. A system, comprising:
a receiver at a receiver end;
a communication link between a transmitter end and the receiver end, and configured to carry first and second signals using differential signaling; and
an electrical overstress (EOS) protection circuit located at the receiver end, and configured to inject charge in response to an undershoot condition in the communication link, and configured to drain charge in response to an overshoot condition in the communication link.

17. The system of claim 16, wherein the EOS protection circuit is configured to drain charge from or inject charge into one or both of the first and second signals.

18. The system of claim 16, wherein the undershoot condition corresponds to transition of the second signal from a high level to a low level while the first signal remains at the low level, and wherein the overshoot condition corresponds to a transition of the second signal from the low level to the high level while the first signal remains at the low level.

19. The system of claim 16, wherein the EOS protection circuit is configured to inject or drain charge to enable at least one device coupled to the communication link to obtain a charge profile in response to the undershoot or overshoot condition.

* * * * *